United States Patent
Yoo et al.

(10) Patent No.: US 10,659,064 B1
(45) Date of Patent: May 19, 2020

(54) PHASE LOCK LOOP CIRCUITS AND METHODS INCLUDING MULTIPLEXED SELECTION OF FEEDBACK LOOP OUTPUTS OF MULTIPLE PHASE INTERPOLATORS

(71) Applicant: Marvell International Ltd., Hamilton (BM)

(72) Inventors: Myung Jae Yoo, Sunnyvale, CA (US); Ahmed Hesham Mostafa, San Jose, CA (US); Manisha Gambhir, Cupertino, CA (US); Zubir Adal, Union City, CA (US)

(73) Assignee: Marvell Asia Pte, Ltd., Singapore (SG)

(*) Notice: Subject to any disclaimer, the term of this patent is extended or adjusted under 35 U.S.C. 154(b) by 0 days.

(21) Appl. No.: 15/895,357

(22) Filed: Feb. 13, 2018

Related U.S. Application Data

(60) Provisional application No. 62/463,437, filed on Feb. 24, 2017.

(51) Int. Cl.
    *H03L 7/099* (2006.01)
    *H03L 7/081* (2006.01)
    *H03L 7/087* (2006.01)

(52) U.S. Cl.
    CPC .............. *H03L 7/099* (2013.01); *H03L 7/081* (2013.01); *H03L 7/087* (2013.01)

(58) Field of Classification Search
    CPC . H03L 7/00; H03L 7/081; H03L 7/087; H03L 7/0891; H03L 7/093; H03L 7/099; H03L 7/10; H03L 7/18

USPC ......................................................... 327/156
See application file for complete search history.

(56) References Cited

U.S. PATENT DOCUMENTS

| | | | |
|---|---|---|---|
| 6,999,543 B1* | 2/2006 | Trinh | H03K 5/135 375/355 |
| 7,116,144 B1 | 10/2006 | Cheng | |
| 7,181,180 B1* | 2/2007 | Teo | H03L 7/081 331/17 |
| 8,233,578 B2 | 7/2012 | Chen et al. | |
| 8,253,454 B2 | 8/2012 | Lin | |
| 8,513,987 B1* | 8/2013 | Kim | H03K 23/42 327/115 |
| 2004/0071251 A1 | 4/2004 | Sutioso et al. | |
| 2007/0211819 A1 | 9/2007 | Greenberg | |
| 2009/0163166 A1 | 6/2009 | Lin | |

(Continued)

*Primary Examiner* — Lincoln D Donovan
*Assistant Examiner* — Dave Mattison

(57) ABSTRACT

A phase lock loop circuit includes a phase frequency detector, a voltage controlled oscillator, a phase interpolator, a clock signal selector, a selection module, a multiplexer, and a divider. The phase frequency detector compares phases of a reference clock and frequency divided output signals and generates an error signal. The voltage controlled oscillator, based on the error signal, generates a phase lock loop output signal and output clock signals. The phase interpolator phase interpolates the output clock signals to generate an interpolator output signal. The clock signal selector selects one of the output clock signals. The selection module generates a selection signal based on states of the interpolator output and selected output clock signals. The multiplexer, based on the selection signal, selects the interpolator output signal or the selected output clock signal. The divider frequency divides an output of the multiplexer to provide the frequency divided output signal.

30 Claims, 6 Drawing Sheets

(56) References Cited

U.S. PATENT DOCUMENTS

| | | |
|---|---|---|
| 2013/0099839 A1 | 4/2013 | Kao et al. |
| 2013/0147531 A1 | 6/2013 | Lee et al. |
| 2014/0266341 A1 | 9/2014 | Jang et al. |
| 2015/0015308 A1 | 1/2015 | Da Dalt |
| 2017/0194976 A1 | 7/2017 | Nonis et al. |
| 2017/0201259 A1 | 7/2017 | Lee et al. |

* cited by examiner

PHASE LOCK LOOP CIRCUITS AND METHODS INCLUDING MULTIPLEXED SELECTION OF FEEDBACK LOOP OUTPUTS OF MULTIPLE PHASE INTERPOLATORS

CROSS-REFERENCE TO RELATED APPLICATIONS

This application claims the benefit of U.S. Provisional Application No. 62/463,437, filed on Feb. 24, 2017. The entire disclosure of the application referenced above is incorporated herein by reference.

FIELD

The present disclosure relates to phase lock loop circuits.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

FIG. 1 shows an example phase lock loop (PLL) circuit 100 (or feedback loop) that includes a phase frequency detector (PFD) 102, a loop filter 104, and a voltage controlled oscillator (VCO) 106 with a divider 110. A reference clock signal $R_{Clk}$ having a reference frequency $F_{REF}$ is provided to the PFD 102. The PFD 102 receives an output of the divider 110 and compares a phase of the output of the divider 110 to a phase of the reference clock signal $R_{Clk}$. The divider 110 can be an N frequency divider, which divides a PLL output clock signal $PLL_{Clk}$ received from the VCO 106, where N is an integer. The PFD 102 generates an error signal based on the comparison. The error signal is filtered by the loop filter 104 (e.g., a low pass filter) and the filtered output of the loop filter 104 is provided to the VCO 106. The VCO 106 generates the PLL output clock signal $PLL_{Clk}$ based on the output of the loop filter 104. The PLL output clock signal $PLL_{Clk}$ has a frequency $F_{VCO}$, which is equal to a product of the reference frequency FREE and a sum of a constant N and a ratio R (i.e. $F_{VCO}=F_{REF}\cdot(N+R)$). In reference to circuit 100, the ratio R is achieved in this loop by modulating the divider ratio. In this case, the divider 110 is controlled by a delta sigma modulator in order to obtain a predetermined fraction.

As another example, FIG. 2 shows a PLL circuit 200 that includes a PFD 202, a loop filter 204, a VCO 206, and a feedback path 208 with a phase interpolator 210 and a divider 212. A reference clock signal $R_{Clk}$ having a reference frequency FREE is provided to the PFD 202. The PFD 202 receives an output of the divider 212 and compares a phase of the output of the divider 212 to a phase of the reference clock signal $R_{Clk}$. The PFD 202 generates an error signal based on the comparison. The error signal is filtered by the loop filter 204 and the filtered output of the loop filter 204 is provided to the VCO 206. The error signal is used as a control signal to control operation of the VCO 206 in generation of the PLL output clock signal $PLL_{Clk}$.

The VCO 206 also generates multiple output clock signals (e.g., 2-16), each of which having the same frequency $F_{VCO}$, but different phases. The more output clock signals generated, the better the resolution of the VCO 206. As an example, the output clock signals may include eight signals having respectively different phases (e.g., ph0-ph7), where the phases refer to different phases of a same period. The eight output clock signals may be equally spaced apart in phase, such that differences in phases between consecutive pairs of the eight output clock signals are the same. Each of the eight output clock signals may have, for example, a phase delay time $\Delta T \cdot (i+1)$, where i is the number of the output clock signal (e.g., i=0, 1, . . . , 7) and $\Delta T$ is the difference in phase between each consecutive pair of the output clock signals.

The phase interpolator 210 receives and interpolates the output clock signals to produce an interpolated output signal. As an example, the interpolated output signal may be a weighted sum of the output clock signals. The divider 212 may be an N frequency divider and divides the PLL output clock signal $PLL_{Clk}$ received from the VCO 206 to provide the output received by the PFD 302, where N is an integer.

SUMMARY

A phase lock loop circuit is provided and includes a phase frequency detector, a voltage controlled oscillator, a phase interpolator, a clock signal selector, a selection module, a multiplexer, and a divider. The phase frequency detector is to (i) compare a phase of a reference clock signal to a phase of a frequency divided output signal, and (ii) generate an error signal based on the comparison. The voltage controlled oscillator is to, based on the error signal, generate a phase lock loop output signal and output clock signals. The phase interpolator is to phase interpolate the output clock signals to generate an interpolator output signal. The clock signal selector is to select one of the output clock signals. The selection module is to generate a selection signal based on (i) a state of the interpolator output signal, and (ii) a state of the selected one of the output clock signals. The multiplexer is to, based on the selection signal, select the interpolator output signal or the selected one of the output clock signals. The divider is to frequency divide an output of the multiplexer to provide the frequency divided output signal.

In other features, a phase lock loop circuit is provided and includes a phase frequency detector, a voltage controlled oscillator, a first phase interpolator, a second phase interpolator, a selection module, a multiplexer and a divider. The phase frequency detector is to (i) compare a phase of a reference clock signal to a phase of a frequency divided output signal, and (ii) generate an error signal based on the comparison. The voltage controlled oscillator is to, based on the error signal, generate a phase lock loop output signal and output clock signals. The first phase interpolator is to interpolate the output clock signals to generate a first interpolator output signal. The second phase interpolator is to receive the output clock signals and output a second interpolator output signal. The selection module is to generate a selection signal based on (i) a state of the first interpolator output signal, and (ii) a state of the second interpolator output signal. The multiplexer is to, based on the selection signal, select the first interpolator output signal or the second interpolator output signal. The divider is to frequency divide an output of the multiplexer to provide the frequency divided output signal.

In other features, a method of operating a phase lock loop circuit is provided. The method includes: comparing a phase of a reference clock signal to a phase of a frequency divided output signal; generating an error signal based on the comparison; based on the error signal, generating a phase lock loop output signal and output clock signals; interpolating the output clock signals to generate a first interpolator output signal; interpolating the output clock signals or selecting one of the output clock signal to generate a second interpolator output signal; generating a selection signal based on (i) a state of the first interpolator output signal, and (ii) a state of the second interpolator output signal; based on the selection signal, selecting via a multiplexer the first interpolator output signal or the second interpolator output signal; and frequency dividing an output of the multiplexer to provide the frequency divided output signal.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

In the drawings, reference numbers may be reused to identify similar and/or identical elements.

DESCRIPTION

Figure 1:
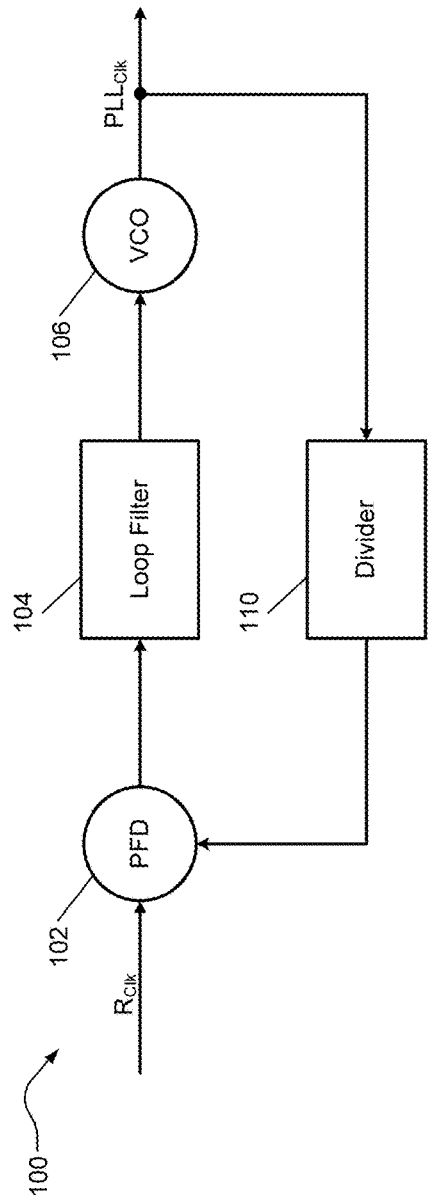
FIG. 1 is a functional block diagram of a traditional PLL circuit.
Figure 2:
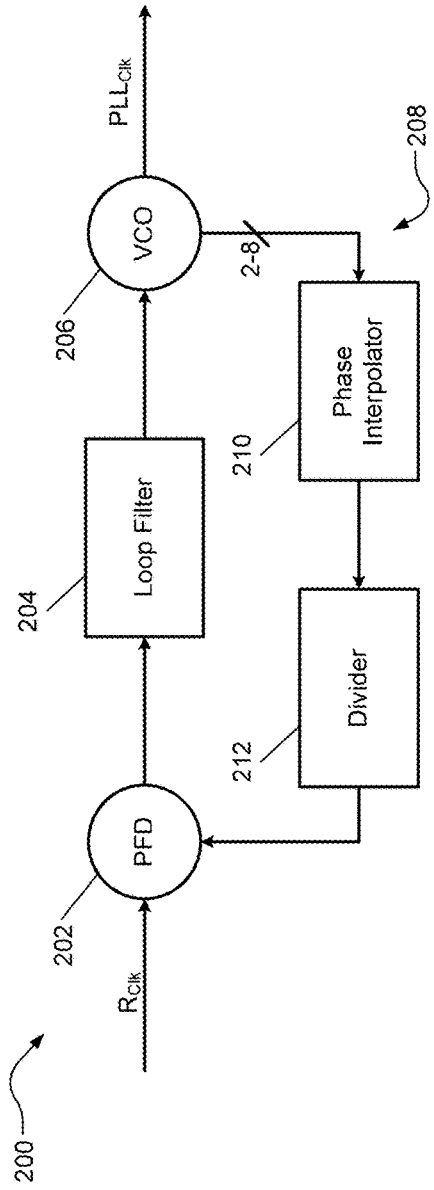
FIG. 2 is a functional block diagram of a traditional PLL circuit including a feedback loop with a phase interpolator.

The phase interpolator 210 of FIG. 2 shifts a phase of the interpolated output signal a certain fixed amount every clock cycle of the reference clock signal $R_{Clk}$. This phase shift amount sets a fractional division part (or ratio R) of the PLL circuit 200. The phase shift amount can be any fractional value between 0 and 1 of a clock cycle (or 1T, where T is a period of 1 clock cycle). The amount of phase shift that can be performed for each clock cycle is limited. If the amount of phase shift exceeds a threshold, an undesired extra pulse edge or glitch may be generated at the output of the phase interpolator 210. The extra pulse edge or glitch can cause an error in the timing of the divider 212. For this reason, a maximum phase shift amount allowed during a single phase jump is much less than a target amount of phase shift. To provide the target amount of phase shift, the phase interpolator 210 needs to phase jump several times with a single cycle of reference clock $R_{Clk}$. A series of jumps can be performed every 1T or 2T of an operating frequency of the VCO 206. As an example, if the target amount of phase shift is 0.5 and each of the PLL output clock signal $PLL_{Clk}$ and the output clock signals experience 10 pulses for each pulse of the reference clock signal $R_{Clk}$, then the length of each of the 10 pulses may be extended (or multiplied) by 1.05. As a result, the accumulated amount of phase shift of 0.5 is equally divided and gradually provided over the 10 pulses.

Each phase jump needs to be completed and the corresponding interpolator output signal needs to be phase stable within the given period of time. Thus, the output of the phase interpolator 210 needs to be phase stable (or settled) within 1T or 2T after each phase jump. In order to meet the settling time requirement, the phase interpolator 210 needs to be fast in order to settle within a clock cycle of the PLL output clock signal $PLL_{Clk}$. The faster the phase interpolator 210 needs to be, the higher the bandwidth requirement and the more power the phase interpolator 210 consumes.

The examples set forth herein and described with respect to FIGS. 3-9 include PLL circuits that incorporate multiple phase interpolators, multiplexer and selection modules in feedback paths. The phase interpolators in an embodiment may have considerably more phase shift settling time than traditional phase interpolators. The phase interpolators may settle within, for example, half of a clock cycle of a reference clock signal, as opposed to within a clock cycle of a PLL output clock signal. This may provide the settling time which is an order of magnitude greater than one needed for the phase interpolator 210 of FIG. 2. For example, a frequency of a reference clock signal may be 25-100 megahertz (MHz), whereas a frequency of a PLL output clock signal may be 1 giga-hertz (GHz). If the reference clock signal is 100 MHz, the amount of time available for the phase interpolators in FIG. 3 to settle may be 5-7 nanoseconds (ns) while the traditional phase interpolator of FIG. 2 would need to settle in 1 ns or less. In addition to providing increased settling time, the number of glitches or extra pulse edges generated and/or experienced at the output of the interpolator and PLL circuits is reduced and/or eliminated. These features are provided while maintaining interpolation resolution while utilizing less bandwidth and less power. The PLL circuit area is also reduced due to incorporation of (i) a first phase interpolator with decreased bandwidth, and (ii) a second phase interpolator operating at a reduced frequency (e.g., $F_{REF}$) with reduced resolution.

Figure 3:
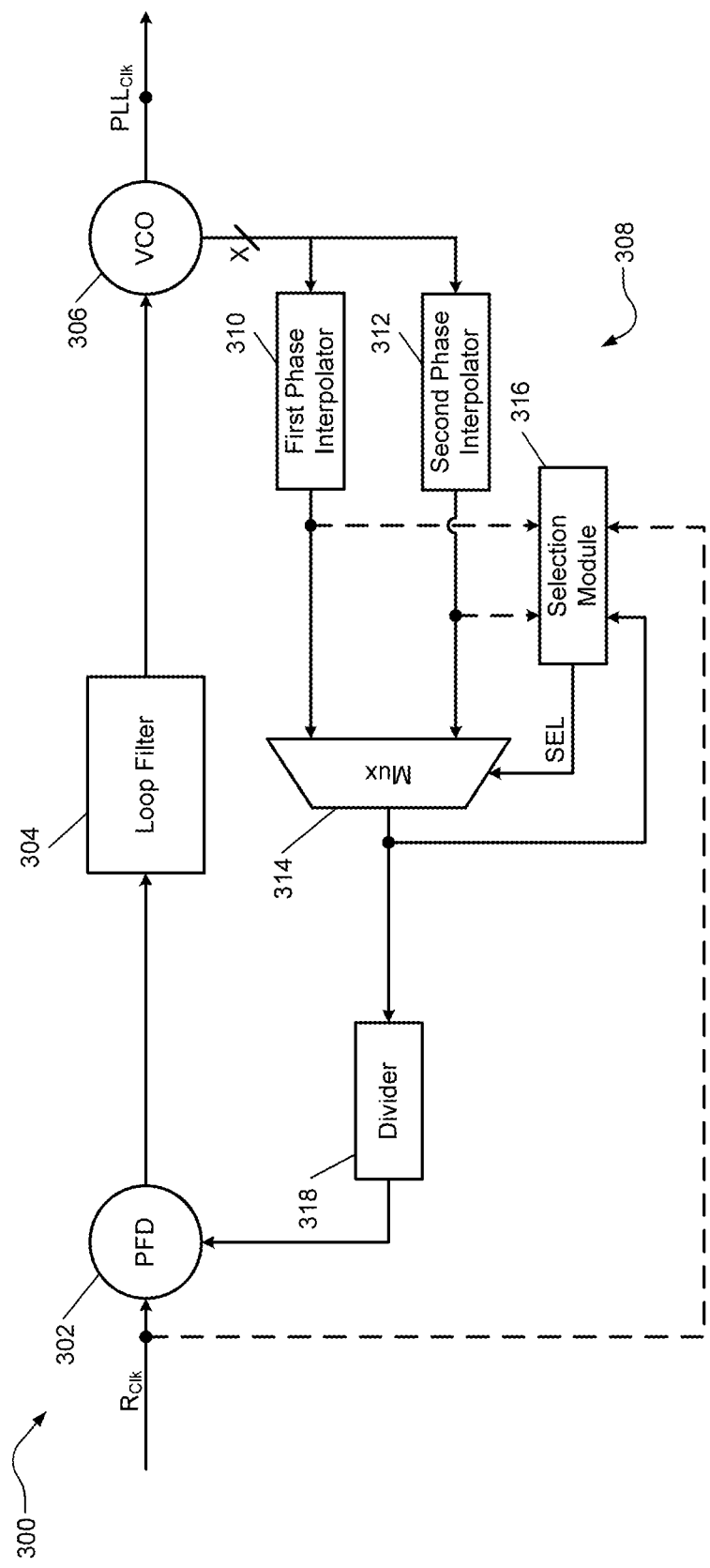
FIG. 3 is a functional block diagram of an example PLL circuit including a feedback loop with multiple phase interpolators and a selection module in accordance with an embodiment of the present disclosure.

FIG. 3 shows an example PLL circuit 300 that includes a PFD 302, a loop filter 304, a VCO 306, and a feedback loop 308. The feedback loop 308 includes a first phase interpolator 310, a second phase interpolator 312, a multiplexer 314, a selection module 316 and a divider 318. A reference clock signal $R_{Clk}$ having a reference frequency $F_{REF}$ is provided to the PFD 302. The PFD 302 receives an output of the divider 318 and compares a phase of the output of the divider 318 to a phase of the reference clock signal $R_{Clk}$. The divider 318 may be an N frequency divider and divides a PLL output clock signal $PLL_{Clk}$ received from the VCO 306 to provide the output received by the PFD 302, where N is an integer. The PFD 302 generates an error signal based on the comparison. The error signal is filtered by the loop filter 304 and the filtered output of the loop filter 304 is provided to the VCO 306. The error signal is used as a control signal to control operation of the VCO 306 in generation of the PLL output clock signal $PLL_{Clk}$.

The VCO 306 also generates X output clock signals (e.g., 2-16), each of which having the same frequency $F_{VCO}$, but different phase, where X is an integer greater than 1. The output clock signals are provided for analog operation of the phase interpolators 310, 312. The more output clock signals generated, the better the accuracy/resolution of interpolation. As an example, the output clock signals may include eight signals having respectively different phases (e.g., ph0-ph7), where the phases refer to different phases of a same period. The eight output clock signals may be equally spaced apart in phase, such that differences in phases between consecutive pairs of the eight output clock signals are the same. Each of the eight output clock signals may have, for example, a phase delay time $\Delta T \cdot (i+1)$, where i is the number of the output clock signal (e.g., i=0, 1, ..., 7) and $\Delta T$ is the difference in phase between each consecutive pair of the output clock signals.

In one embodiment, both the first phase interpolator 310 and the second phase interpolator 312 are a same type of interpolator and receive and interpolate the output clock signals to produce interpolated output signals. Each of the phase interpolators 310, 312 for this embodiment have the same resolution (e.g., 7 bit resolution). As an example, the interpolated output signals may be a weighted sum of the output clock signals. In this embodiment, the first phase interpolator 310 operates as a primary phase interpolator and the second phase interpolator 312 operates as a secondary phase interpolator, where the output of the second phase interpolator 312 is out of phase with the output of the first phase interpolator 310.

The multiplexer 314 is used to select an output of the phase interpolators 310, 312. The selection module 316 generates a selection signal SEL to select one of the outputs of the phase interpolators 310, 312. This selection may be based on states of the outputs of the phase interpolators 310, 312, a state of the output of the multiplexer 314 and/or the reference clock signal $R_{Clk}$.

Each of the phase interpolators 310, 312 is used at alternative cycles of the reference clock signal $R_{Clk}$. While an output of one of the phase interpolators 310, 312 is selected and used as the output of the multiplexer 314, the other phase interpolator performs a phase jump (i.e. changes a phase of an output of that phase interpolator). Since the output of the PLL circuit 300 does not see the output of the phase interpolator performing the phase jump, an extra pulse that may be generated by the phase interpolator performing the phase jump is not provided to the subsequent divider. Because of this, each of the phase interpolators 310, 312 may jump any amount of phase at one time, instead of over multiple PLL clock cycles. In an embodiment, each of the phase interpolators 310, 312 needs to perform only a single phase jump per corresponding clock cycle of the reference clock signal $R_{Clk}$. The phase interpolator performing the phase jump for a current clock cycle of the reference clock signal $R_{Clk}$ settles before a next rising edge of the reference clock signal $R_{Clk}$. This provides significantly more time to settle than traditional phase interpolators of PLL circuits, which reduces the corresponding bandwidth requirement. This also makes the phase update rate at that of the FREE clock frequency, which is significantly lower than the VCO clk frequency. This saves a significant amount of power and eliminates concern of glitches being generated at the phase interpolator while a phase jump is being applied.

Figure 4:
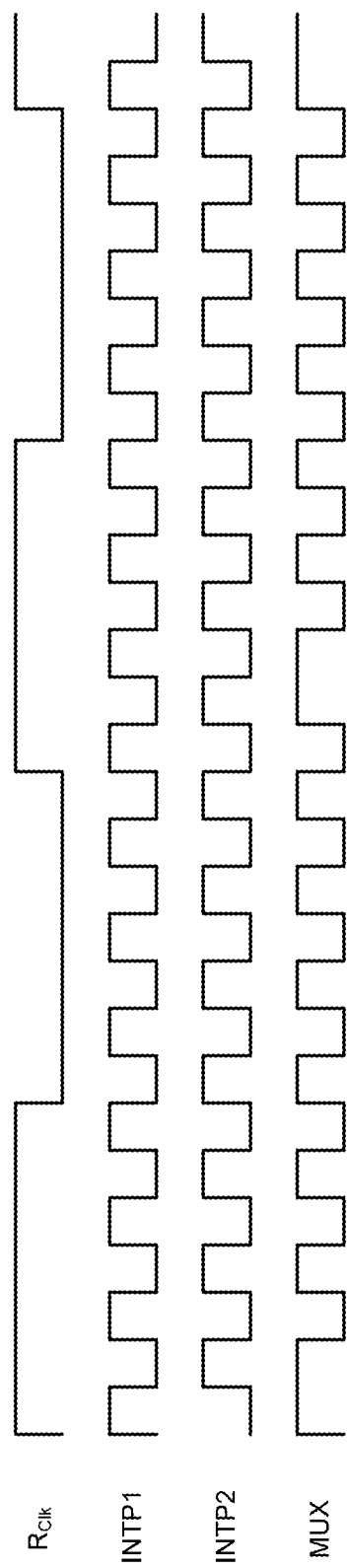
FIG. 4 is an example timing diagram illustrating multiplexer selection of outputs of the phase interpolators of FIG. 3.

FIG. 4 shows an example timing diagram illustrating multiplexer selection of outputs of the phase interpolators 310, 312 for the stated embodiment. The timing diagram includes an example of the reference clock signal $R_{Clk}$, an output INTP1 of the first phase interpolator 310, an output INTP2 of the second phase interpolator 312, and an output MUX of the multiplexer 314. As an example, the selection module 316 monitors the states of the signals INTP1, INTP2. At the rising edge of the reference clock signal $R_{Clk}$, the selection module 316 detects when INTP1 is HIGH and then provides INTP1 to the divider 318. Subsequent to providing INTP1 to the divider 318, the selection module 316 maintains the output of the multiplexer 314 in a '1' or HIGH state and waits until INTP2 is HIGH and then outputs INTP2 to the divider 318. The output of INTP2 is then provided to the divider 318 until the next cycle of the reference clock signal $R_{Clk}$. The selection module 316 then monitors when INTP2 is HIGH, waits until INTP1 is HIGH, and then switches from providing INTP2 to providing INTP1. This provides a phase change once per cycle of the reference clock signal $R_{Clk}$.

Although the above-described embodiment increases available settling time and thus reduces bandwidth requirement and corresponding power consumption, a switching mismatch between the phase interpolators 310, 312 can occur. For example, there can be a different amount of delay in the operations of the interpolators 310, 312, such that the phase shift amount from selecting the output of the first phase interpolator 310 to selecting the output of the second phase interpolator 312 is different than the phase shift amount from selecting the output of the second phase interpolator 312 to selecting the output of the first phase interpolator 310. This results in a different phase shift amount from the first phase interpolator 310 to the second phase interpolator 312 than from the second phase interpolator to the first phase interpolator 310, which causes the PLL circuit 300 to have two different fractional division values for R. The two fractional division values are different due to the direction of transitioning (i.e. from the first phase interpolator 310 to the second phase interpolator 312 or from the second phase interpolate 312 to the first phase interpolator 310).

To overcome this potential phase mismatch issue, operation of the second phase interpolator 312 and the selection module 316 may be altered as described below with respect to the disclosed example embodiments. The first phase interpolator 310 is used as the primary interpolator and has full target/high resolution (e.g., 7 bit resolution) and the second phase interpolator 312 is temporarily used and may have low resolution (e.g., 3 bit resolution). The second phase interpolator 312 does not need a full target resolution because the PLL circuit 300 does not compare and/or utilize the phase of the second phase interpolator for phase adjustment of the PLL output clock signal $PLL_{Clk}$.

The first phase interpolator 310 is used to set phase at rising and/or falling edges of a reference clock signal $R_{Clk}$. The second phase interpolator 312 is simply used for providing a clock signal during a period between the rising and/or falling edges of the reference clock signal $R_{Clk}$. The second phase interpolator 312 is used when the first phase interpolator 310 is performing a phase jump. The phase jump includes the corresponding settling time. Once the phase jump of the first phase interpolator 310 settles, the output of the first phase interpolator 310 is selected. The function of the second phase interpolator 312 is temporary sending a clock signal to the divider 318 while the first phase interpolator 310 performs a phase jump and settles. The output of the second phase interpolator 312 may have a similar phase as the first phase interpolator 310 in order to provide smooth transitions between the outputs of the phase interpolators 310, 312. This may occur when the multiplexer 314 switches from the second phase interpolator 312 to the first phase interpolator 310.

Although the first phase interpolator 310 may phase interpolate two or more of the output clock signals received from the VCO 306, the second phase interpolator 312 may perform as a clock signal selector rather than as a phase interpolator. For example, in one embodiment, when 8 output clock signals are received from the VCO 306, the second phase interpolator 312 selects one of the 8 output clock signals. This selection is performed instead of phase interpolating the 8 output clock signals. The first phase interpolator 310 interpolates the output clock signals to produce an interpolated output signal and the second phase interpolator 312 simply selects one of the output clock signals. By allowing lower resolution in the second phase interpolator 312, may be made smaller in size and may consume less power than the first phase interpolator 310.

Within each cycle of the reference clock signal $R_{Clk}$, the selection module 316 transitions twice. The first transition is from the output of the first phase interpolator 310 to the output of the second phase interpolator 312. The second transition is from the output of the second phase interpolator 312 to the output of the first phase interpolator 310. When the PFD 302 compares the reference clock signal $R_{Clk}$ to an output of the divider 318 for phase adjustment at, for example, rising edges of the reference clock signal $R_{Clk}$, the output of the first phase interpolator 310 is selected and used. The output of the second phase interpolator 312 is not used for phase adjustment of the PLL output clock signal $PLL_{Clk}$. This allows the accuracy of the second phase interpolator 312 to be reduced (i.e. have low resolution). The accuracy of the second phase interpolator 312 may be less than the accuracy of the first phase interpolator 310. Due to the stated selection of the outputs of the phase interpolators 310, 312, the output of the PLL circuit 300 (i.e. output of the VCO 306) does not experience any superfluous pulses that may occur in the outputs of the phase interpolators 310, 312 during a phase jump. The first phase interpolator 310 is provided with a substantial amount of time to settle prior to a next rising edge of the reference clock signal $R_{Clk}$ and as a result any extra pulse edge, pulse and/or glitches are not seen at an input of the divider circuit. This eliminates a need for fast phase jump settling, which reduces bandwidth and power requirements.

Figure 5:
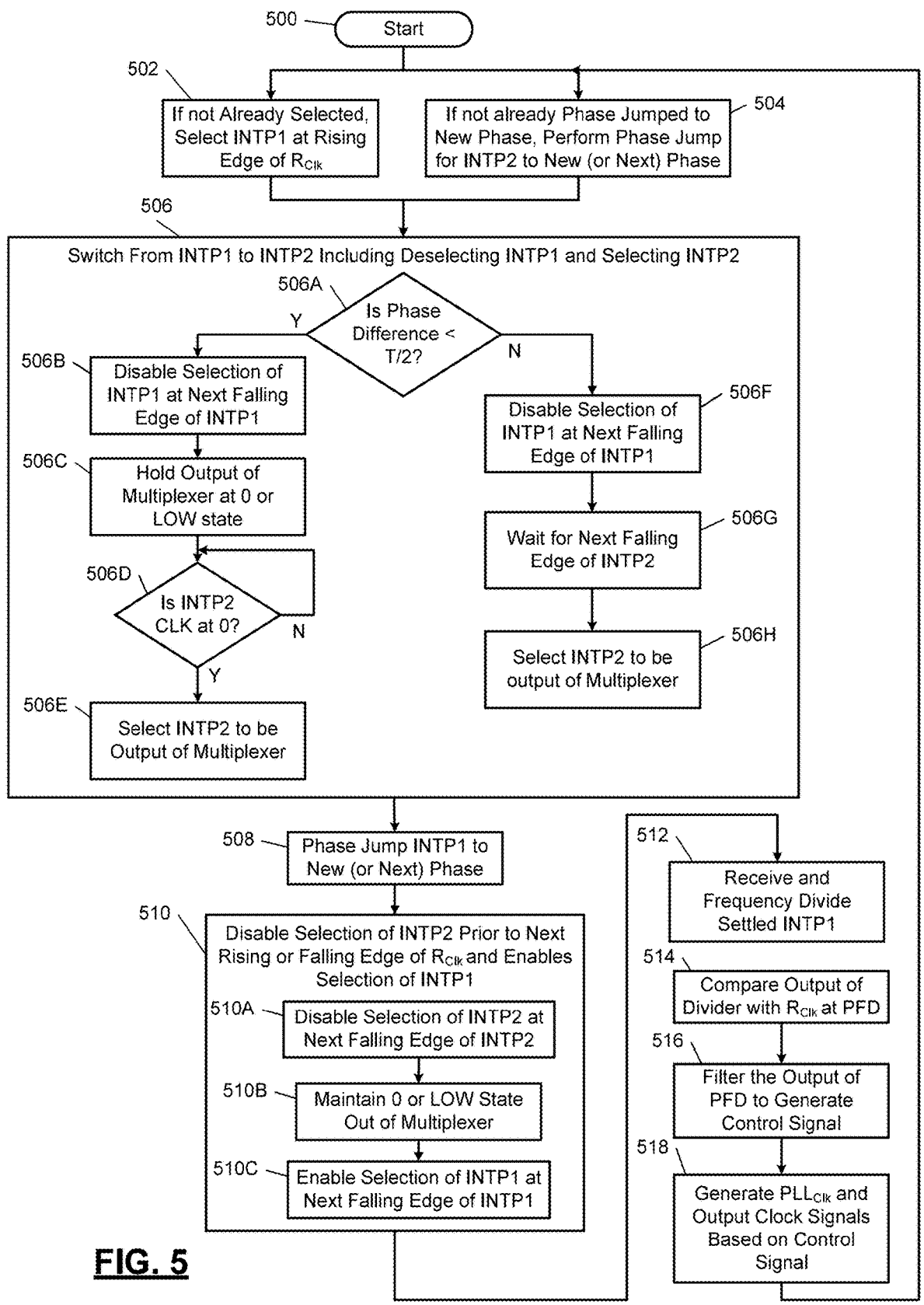
FIG. 5 illustrates an example PLL operation method in accordance with an embodiment of the present disclosure.
Figure 6:
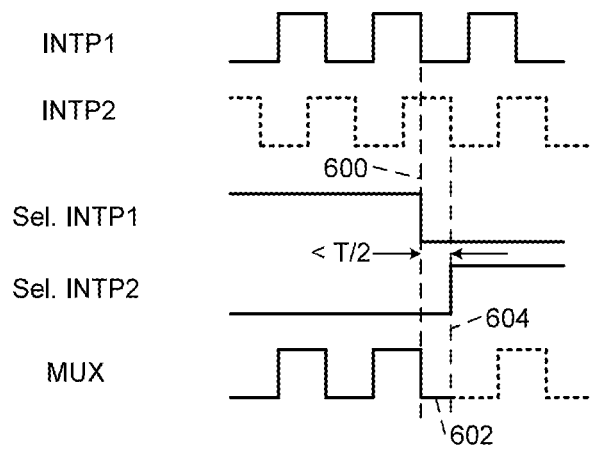
FIG. 6 is an example timing diagram illustrating output selection switching from a first phase interpolator to a second phase interpolator when a phase difference is less than a predetermined value in accordance with an embodiment of the present disclosure.
Figure 7:
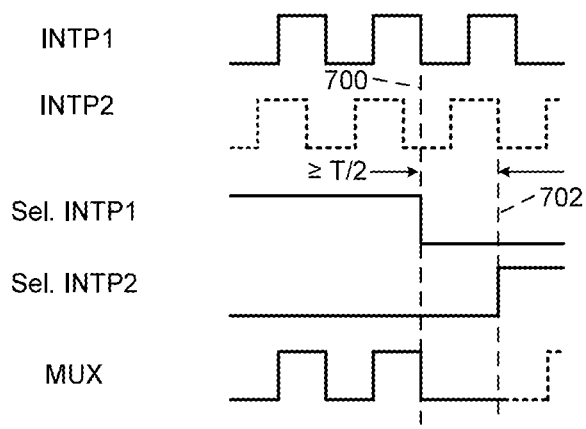
FIG. 7 is an example timing diagram illustrating output selection switching from the first phase interpolator to the second phase interpolator when a phase difference is greater than or equal to the predetermined value in accordance with an embodiment of the present disclosure.
Figure 8:
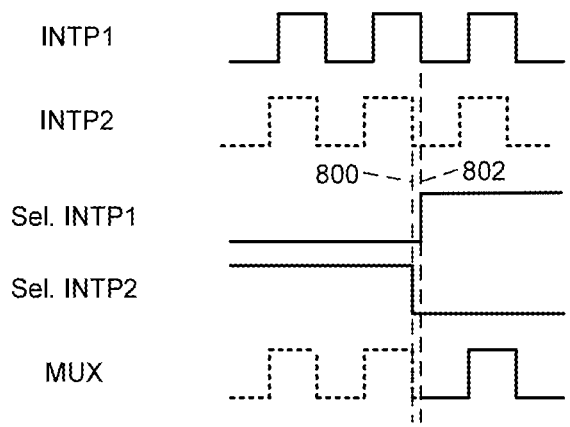
FIG. 8 is an example timing diagram illustrating output selection switching from the second phase interpolator to the first phase interpolator in accordance with an embodiment of the present disclosure.
Figure 9:
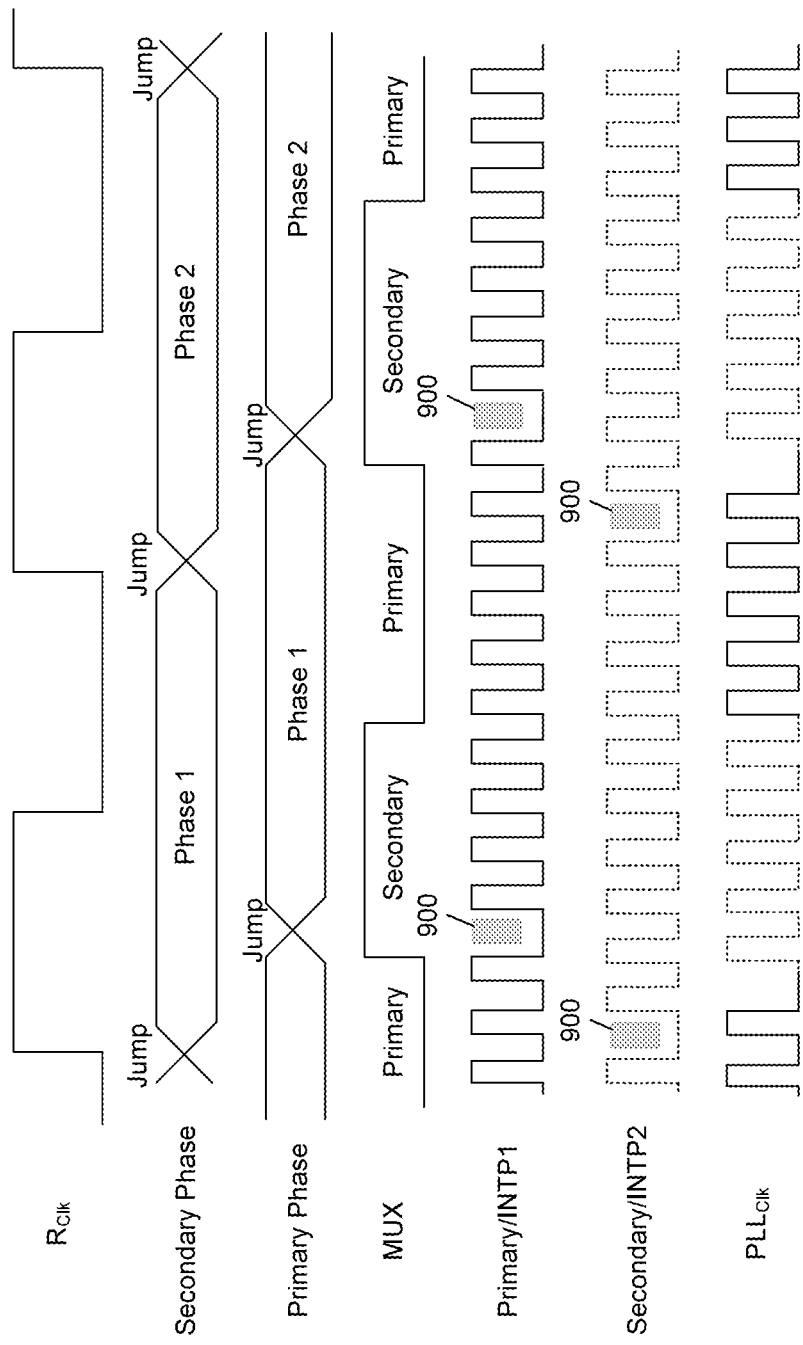
FIG. 9 is an example timing diagram illustrating phases of the interpolators and output signals of the PLL circuit of FIG. 3.

The PLL circuit 300 of FIG. 3 may be operated using numerous methods, an example method is illustrated in FIG. 5. In FIG. 5, a PLL operation method is shown. Although the following operations are primarily described with respect to the implementations of FIGS. 3 and 5-9, the operations may be easily modified to apply to other implementations of the present disclosure. The operations may be iteratively performed. The method may begin at 500 and describes how the phase interpolators 310, 312 perform phase jumps and how the selection module 316 controls selection of the outputs of the phase interpolators 310, 312 via the multiplexer 314. Selection of the outputs of the phase interpolators 310, 312 by the multiplexer 314 is also described below with references to the timing diagrams of FIGS. 6-9. FIGS. 6-8 show examples of (i) the output signals of the phase interpolators INTP1, INTP2, where selection of the output signals is designated as "Sel. INTP1" and "Sel. INTP2", and (ii) the output of the multiplexer 314. The output signal INTP1 is shown as a solid line and the output signal INTP2 is shown as a dashed line. FIG. 9 shows examples of: the reference clock signal $R_{Clk}$; the phases of the output signals of the phase interpolators 310, 312; the output of the multiplexer 314; outputs of the phase interpolators 310, 312, which are designated as Primary/INTP1 and Secondary/INTP2; and the output of the PLL circuit 300.

At 502, the selection module 316 selects output of the first phase interpolator 310 at a rising edge of the reference clock signal $R_{Clk}$. An example of the reference clock signal $R_{Clk}$ is shown in FIG. 9. At this time, the output of the first phase interpolator 310 has stable phase P1. At 504, the second phase interpolator 312 performs a phase jump to a new (or next) phase P2. Operation 504 is performed during and/or subsequent to operation 502.

At 506, the multiplexer 314 selects the output of the second phase interpolator 312. At 2-4T (or 2-4 clock cycles) of the PLL output clock signal $PLL_{Clk}$ later in time, the second phase interpolator 312 is close to settling and being in a phase stable state. The second phase interpolator 312 does not need to be completely settled at this time, since the PLL circuit 300 does not look at the phase of INTP2, but rather counts pulses of INTP2.

At 506A, the selection module 316 determines whether the phase difference between the output clocks of the two interpolators (or the PLL fraction amount R) is less than T/2, where T is equal to a period of a single clock cycle of INTP1. The phase difference refers to the interpolator phase difference between two reference clock cycles. When the PLL fraction amount R is not 0, the interpolator keeps changing phase of the interpolator by a same amount (e.g., by R) at every reference clock cycle. Since a period of INTP2 and a period of $PLL_{Clk}$ may be the same as the period of INTP1, T may also be equal to the period of a single clock cycle of INTP2 and/or a period of a single clock cycle of $PLL_{Clk}$. If the phase difference between the output clocks of the two interpolators (or the PLL fraction amount R) is less than T/2, then operation 506B is performed, otherwise operation 506F is performed. The phase difference being greater than T/2 is provided by digital block and increments the phase coming to INTP1/INTP2. The selection block module 316 uses this information to determine a sequence to enable/disable the multiplexer 314.

At 506B and when the PLL fraction amount is less than T/2, the selection module 316, at the next falling edge of output clock signal INTP1, disables selection of INTP1. This is shown in FIG. 6. The time at which this occurs is identified by dashed line 600. At 506C, the selection module 316 holds the output of the multiplexer at '0' or at a LOW state. This is designated 602. At 506D, the selection module 316 determines wherein INTP2 CLK is at 0. If this is true, then operation 506E is performed. At 506E, the selection module 316 selects INTP2 to be output from the multiplexer 314. This is shown by dashed line 604. When the phase difference is small, the selection module 316 doesn't have enough time to detect falling edge of INTP2 after it detects falling edge of INTP1 CLK. The selection module 316 uses level '0' to switch to INTP2. An edge is one time event. Thus, if an edge is missed, then the system waits until next edge comes. On the other hand, level 0 stays for T/2. As a result, as long as level 0 is sensed within T/2, then the selection module 316 does not wait for a next edge.

At 506F and when the PLL fraction amount is greater than or equal to T/2, the selection module 316, at the next falling edge of INTP1, disables selection of INTP1. This is shown in FIG. 7. The time at which this occurs is identified by dashed line 700. At 506G, the selection module 316, when the phase difference (or the PLL fraction amount R) is greater than or equal to T/2, waits for a next falling edge of INTP2. At 506H, the selection module 316 selects INTP2 to be output from the multiplexer 314. This is shown by dashed line 702. If the phase difference (or PLL fraction amount R) is less than T/2, then INTP2 is '0' or LOW and the selection module 316 is to wait until the next '0' state or LOW state of INTP2 before selecting INTP2. When the phase difference is greater than or equal to T/2, the selection module 316 has enough time to detect a falling edge of INTP2 after the selection module 316 detects a falling edge of INTP1. For this reason, the falling edge of INTP2 is used as the enabler to selecting INTP2 instead of a '0' state or LOW state of INTP2, as used when the phase difference (or the PLL fraction amount R) is less than T/2.

At 508, after the selection module 316 selects INTP2, the first phase interpolator 310 performs a phase jump to the new (or next) phase P2. While the first phase interpolator 310 performs the phase jump and settles, INTP2 is provided to the divider 318.

At 510, the selection module 316, before the next rising or falling edge of reference clock signal $R_{Clk}$, disables selection of INTP2 and enables selection of INTP1. The multiplexer 314 switches back to outputting the output of the first phase interpolator (or the primary clock signal). This may occur, for example, 4-6T later, depending on the frequency of INTP1. At this time, the phase difference between INTP1 and INTP2 may be less than T/8 due to the coarser resolution of INTP2. In one embodiment, INTP2 is always earlier or the same in phase as INTP1.

At 510A, the selection module 316, at the falling edge of INTP2, disables selection of INTP2. This is shown in FIG. 8 by dashed line 800. At 510B, the selection module 316 maintains a '0' output or LOW output state out of the multiplexer 314. At 510C, the selection module 316, at a next falling edge of INTP1, enables selection of INTP1. This is shown by dashed line 802.

At 512 and at, for example, the next rising edge of the reference clock signal $R_{Clk}$, the divider 318 receives the settled clock signal from the first (or primary) phase interpolator 312 and frequency divides the settled clock signal to provide a divided output signal.

At 514, the PFD 302 compares the phase of the output of the divider 318 with the phase of the reference clock signal $R_{Clk}$. At 516, the loop filter 304 filters the output of the PFD 302 to generate a control signal. At 518, the VCO, based on the control signal, generates the PLL output clock signal $PLL_{Clk}$ and output clock signals to be provided to the phase interpolators 310, 312. Subsequent to operation 518, operation 502 may be performed. During the next iteration of operations 502-518, the phase of INTP1 may be transitioned back to P1.

During the above-described method, the output signals INTP1, INTP2 of the phase interpolators 310, 312 may experience one or more glitches, such as one or more extra pulses and/or edges. Example times of when this may occur are identified as 900. Although these glitches may occur, these glitches are not seen and/or provided to the divider 318 and the output of the PLL circuit 300. This is because, when the glitches of the INTP1 occur, INTP2 is selected by the selection module 316 and when the glitches of INTP2 occur, INTP1 is selected by the selection module 316.

Instead of spreading the target phase adjustment amount over multiple pulses of the PLL output clock signal $PLL_{Clk}$, target phase adjustment amount may be provided at a much slower rate at rising edges of the reference clock signal $R_{Clk}$.

By implementing the above method, the settling time requirement is relaxed compared to performing phase jumps at every 1T or 2T of an output clock signal of a VCO 306, as traditionally performed. From the timing diagram of FIG. 9, it can be seen that the first phase interpolator 310 is to settle prior to a next rising edge of the reference clock signal $R_{Clk}$, which occurs subsequent to the first phase interpolator 310 performing a phase jump at 2-4T after a previous rising edge of the reference clock signal $R_{Clk}$. As an example, the allowed settling time may be 0.5 times a period of a clock cycle of the reference clock signal $R_{Clk}$. In one embodiment, a minimum ratio between a period or frequency of the PLL output clock signal $PLL_{Clk}$ and a period or frequency of the reference clock signal $R_{Clk}$ is 12. In this embodiment, the first phase interpolator 310 has 8T of a slowest frequency of the PLL output clock signal $PLL_{Clk}$ to settle. This is about ⅔ of a clock cycle period of the reference clock signal $R_{Clk}$. With this increased available settling time, the bandwidth of the first phase interpolator 310 is reduced compared to that of, for example, the phase interpolator 210 of FIG. 2.

When the multiplexer 314 switches from INTP1 to INTP2, there may also be an extra pulse if switching is not performed properly. This is because the phase of INTP1 and INTP2 may not be the same. As an example, the phase of INTP2 may be any later phase within 1T from the phase of INTP1. Prior to the phase of INTP1 jumping to a next phase, the multiplexer 314 deselects INTP1 at a falling edge of INTP1, and then selects INTP2 (i) when INTP2 is LOW and the phase difference is less than T/2, or (ii) at the falling edge of INTP2, when the phase difference is greater than or equal to T/2. Once INTP2 is selected, the output of INTP2 is provided to the divider 318 for a period of time that is enough for INTP1 to settle. Clock logic levels of both INTP1 and INTP2, at the time instant of selection, are at LOW states. By selecting INTP1 and INTP2 as stated, the transition does not generate an extra pulse.

When switching from INTP2 to INTP1, both INTP1 and INTP2 are settled at approximately the same (or new) phase, such that the phase difference between INTP1 and INTP2 is 0-T/8 due to the differences in resolutions of the phase interpolators 310, 312. The phase of INTP2 is earlier or the same as the phase of INTP1. At this time, the multiplexer 314 deselects INTP2 at the falling edge of INTP2, and selects INTP1 at the falling edge of INTP1. By switching at falling edge of INTP1 or logic level 0, both clock logic levels of INTP1 and INTP2 are the same and the transition does not generate an extra pulse.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

In this application, apparatus elements described as having particular attributes or performing particular operations are specifically configured to have those particular attributes and perform those particular operations. Specifically, a description of an element to perform an action means that the element is configured to perform the action. The configuration of an element may include programming of the element, such as by encoding instructions on a non-transitory, tangible computer-readable medium associated with the element.

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C #, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

None of the elements recited in the claims are intended to be a means-plus-function element within the meaning of 35 U.S.C. § 112(f) unless an element is expressly recited using the phrase "means for," or in the case of a method claim using the phrases "operation for" or "step for."

What is claimed is:

1. A phase lock loop circuit comprising:
a phase frequency detector to (i) compare a phase of a reference clock signal to a phase of a frequency divided output signal, and (ii) generate an error signal based on the comparison;
a voltage controlled oscillator to, based on the error signal, generate a phase lock loop output signal and a plurality of output clock signals;
a phase interpolator to phase interpolate the plurality of output clock signals to generate an interpolator output signal;
a clock signal selector to select one of the plurality of output clock signals;
a selection module to
receive the interpolator output signal and the one of the plurality of output clock signals, and
generate a selection signal based on (i) a state of the interpolator output signal, and (ii) a state of the selected one of the plurality of output clock signals;
a multiplexer to, based on the selection signal, select the interpolator output signal or the selected one of the plurality of output clock signals; and
a divider to frequency divide an output of the multiplexer to provide the frequency divided output signal.

2. The phase lock loop circuit of claim 1, wherein the clock signal selector has a lower resolution than the phase interpolator.

3. The phase lock loop circuit of claim 1, wherein:
the phase interpolator phase interpolates the plurality of output clock signals to provide the interpolator output signal; and
the phase of the one of the plurality of output clock signals is different than the phase of the interpolator output signal.

4. The phase lock loop circuit of claim 1, wherein the phase of the one of the plurality of output clock signals is the same as the phase of the interpolator output signal.

5. The phase lock loop circuit of claim 1, wherein:
the phase of the one of the plurality of output clock signals is within a predetermined range of the phase of the interpolator output signal; and
a difference between the phase of the interpolator output signal and the phase of the one of the plurality of output clock signals is based on (i) a resolution of the phase interpolator, and (ii) the resolution of the clock signal selector.

6. The phase lock loop circuit of claim 1, wherein the selection module is to:
select via the multiplexer the interpolator output signal;
phase jump the one of the plurality of output clock signals while providing the interpolator output signal at an output of the multiplexer;
subsequent to the phase jump of the one of the plurality of output clock signals, switch from selecting the interpolator output signal to selecting the one of the plurality of output clock signals; and
subsequent to the selection of the one of the plurality of output clock signals, phase jump the interpolator output signal while providing the one of the plurality of output clock signals at the output of the multiplexer.

7. A phase lock loop circuit comprising:
a phase frequency detector to (i) compare a phase of a reference clock signal to a phase of a frequency divided output signal, and (ii) generate an error signal based on the comparison;
a voltage controlled oscillator to, based on the error signal, generate a phase lock loop output signal and a plurality of output clock signals;
a first phase interpolator to interpolate the plurality of output clock signals to generate a first interpolator output signal;
a second phase interpolator to receive the plurality of output clock signals and output a second interpolator output signal;
a selection module to generate a selection signal based on (i) a state of the first interpolator output signal, and (ii) a state of the second interpolator output signal;
a multiplexer to, based on the selection signal, select the first interpolator output signal or the second interpolator output signal; and
a divider to frequency divide an output of the multiplexer to provide the frequency divided output signal.

8. The phase lock loop circuit of claim 7, wherein the selection module is to:
monitor states of the first interpolator output signal and the second interpolator output signal;
generate the selection signal to select the first interpolator output signal at a rising edge of the first interpolator output signal; and
generate the selection signal to select the second interpolator output signal at a next rising edge of the second interpolator output signal, where the rising edge of the second interpolator output signal is a next rising edge of the second interpolator output signal subsequent to the rising edge of the first interpolator output signal,
wherein the selection of the first interpolator output signal occurs at a rising edge of the reference clock signal to phase adjust the phase lock loop output signal for a corresponding clock cycle of the reference clock signal.

9. The phase lock loop circuit of claim 8, wherein the phase adjustment of the phase lock loop output signal is a total phase adjustment of the phase lock loop output signal for the corresponding clock cycle of the reference clock signal.

10. The phase lock loop circuit of claim 7, wherein the selection module is to alternate between (i) switching phases of the first interpolator output signal and the second interpolator output signal from a first phase to a second phase, and (ii) switching the phases of the first interpolator output signal and the second interpolator output signal from the second phase to the first phase.

11. The phase lock loop circuit of claim 7, wherein the first phase interpolator has a same resolution and the second phase interpolator.

12. The phase lock loop circuit of claim 7, wherein the second phase interpolator has a lower resolution than the first phase interpolator.

13. The phase lock loop circuit of claim 7, wherein:
the second phase interpolator phase interpolates the plurality of output clock signals to provide the second interpolator output signal; and
the phase of the second interpolator output signal is different than the phase of the first interpolator output signal.

14. The phase lock loop circuit of claim 7, wherein:
the second phase interpolator selects one of the plurality of output clock signals to provide as the second interpolator output signal; and
the phase of the second interpolator output signal is the same as the phase of the first interpolator output signal.

15. The phase lock loop circuit of claim 7, wherein:
the second phase interpolator selects one of the plurality of output clock signals to provide as the second interpolator output signal;
the phase of the second interpolator output signal is within a predetermined range of the phase of the first interpolator output signal; and
a difference between the phase of the first interpolator output signal and the phase of the second interpolator output signal is based on (i) a resolution of the first phase interpolator, and (ii) a resolution of the second phase interpolator.

16. A method of operating a phase lock loop circuit, the method comprising:
comparing a phase of a reference clock signal to a phase of a frequency divided output signal;
generating an error signal based on the comparison;
based on the error signal, generating a phase lock loop output signal and a plurality of output clock signals;
interpolating the plurality of output clock signals to generate a first interpolator output signal;
interpolating the plurality of output clock signals or selecting one of the plurality of output clock signal to generate a second interpolator output signal;
generating a selection signal based on (i) a state of the first interpolator output signal, and (ii) a state of the second interpolator output signal;
based on the selection signal, selecting via a multiplexer the first interpolator output signal or the second interpolator output signal; and
frequency dividing an output of the multiplexer to provide the frequency divided output signal.

17. The method of claim 16, further comprising:
determining whether a phase difference indicated by the error signal is less than a predetermined amount of a period of a clock cycle of (i) the phase lock loop output signal, or (ii) the first interpolator output signal;
if the phase difference is less than the predetermined amount of the period of the clock cycle, then
disabling selection of the first interpolator output signal at a next falling edge of the first interpolator output signal, and
holding an output of the multiplexer at a LOW state and then selecting via the multiplexer the second interpolator output signal; and
if the phase difference is greater than or equal to the predetermined amount of the period of the clock cycle, then
disabling selection of the first interpolator output signal at a next falling edge of the first interpolator output signal, and
waiting for next falling edge of the second interpolator output signal and then selecting via the multiplexer the second interpolator output signal.

18. The method of claim 16, further comprising:
selecting via the multiplexer the first interpolator output signal;
phase jumping the second interpolator output signal while providing the first interpolator output signal at an output of the multiplexer;
subsequent to the phase jumping of the second interpolator output signal, switching from selecting the first interpolator output signal to selecting the second interpolator output signal; and
subsequent to the selection of the second interpolator output signal, phase jumping the first interpolator output signal while providing the second interpolator output signal at the output of the multiplexer.

19. The method of claim 18, further comprising:
subsequent to the phase jumping of the first interpolator output signal, disabling selection of the second interpolator output signal prior to next rising or falling edge of reference clock signal; and
enabling selection of the first interpolator output signal.

20. The method of claim 18, further comprising:
subsequent to the phase jumping of the first interpolator output signal, disabling selection of the second interpolator output signal at a next falling edge of the second interpolator output signal;
maintaining the output of the multiplexer at a LOW state; and
enabling selection of the first interpolator output signal at a next falling edge of the first interpolator output signal.

21. The phase lock loop circuit of claim 1, wherein the selection module is to receive the interpolator output signal from the phase interpolator and the one of the plurality of output clock signals from the clock signal selector.

22. The phase lock loop circuit of claim 7, wherein the selection module is to receive the first interpolator output signal and the second interpolator output signal.

23. The phase lock loop circuit of claim 7, wherein the multiplexer is to select:
the first interpolator output signal at rising and falling edges of the reference clock signal such that the first phase interpolator sets phases at the rising and falling edges of the reference clock signal; and
the second interpolator output signal during periods between the rising and falling edges of the reference clock signal such that the second interpolator output signal is used during periods between the rising and falling edges of the reference clock signal and while the first phase interpolator is performing a phase jump.

24. The phase lock loop circuit of claim 7, wherein, within a cycle of the reference clock signal, the multiplexer transitions from selecting the first interpolator output signal to selecting the second interpolator output signal and then transitions back to selecting the first interpolator output signal.

25. The phase lock loop circuit of claim 7, wherein:
the multiplexer is to select the first interpolator output signal when the phase frequency detector compares the reference clock signal to the phase of the frequency divided output signal for phase adjustment, and
the second phase interpolator is not used for phase adjustment.

26. The phase lock loop circuit of claim 7, wherein:
the first phase interpolator phase interpolates the plurality of output clock signals and does not select one of the plurality of output clock signals; and
the second phase interpolator performs as a clock signal selector and selects one of the plurality of output clock signals.

27. The phase lock loop circuit of claim 1, wherein the phase interpolator is to receive the plurality of output clock signals from the voltage controlled oscillator.

28. The phase lock loop circuit of claim 1, wherein the multiplexer is to receive the interpolator output signal and the selected one of the plurality of output signals.

29. The phase lock loop circuit of claim 1, wherein the selection module is to:
receive at least one of the reference clock signal or an output of the multiplexer; and generate the selection signal based on at least one of the reference clock signal or the output of the multiplexer.

30. The phase lock loop circuit of claim 1, wherein the selection module is to:
 receive the reference clock signal and an output of the multiplexer; and
 generate the selection signal based on the reference clock signal and the output of the multiplexer.

* * * * *